(12) United States Patent
Fuergut et al.

(10) Patent No.: US 7,767,495 B2
(45) Date of Patent: Aug. 3, 2010

(54) METHOD FOR THE FABRICATION OF SEMICONDUCTOR DEVICES INCLUDING ATTACHING CHIPS TO EACH OTHER WITH A DIELECTRIC MATERIAL

(75) Inventors: Edward Fuergut, Dasing (DE); Joachim Mahler, Regensburg (DE); Carsten von Koblinski, Villach (AT); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 8 days.

(21) Appl. No.: 12/197,602

(22) Filed: Aug. 25, 2008

(65) Prior Publication Data

US 2010/0044885 A1 Feb. 25, 2010

(51) Int. Cl.
*H01L 21/44* (2006.01)
*H01L 21/50* (2006.01)
(52) U.S. Cl. .......... 438/110; 438/125; 438/660
(58) Field of Classification Search .......... None
See application file for complete search history.

(56) References Cited

U.S. PATENT DOCUMENTS

| | | | | |
|---|---|---|---|---|
| 4,762,606 A | * | 8/1988 | Root .......... | 206/701 |
| 4,930,216 A | * | 6/1990 | Nelson .......... | 29/854 |
| 5,356,838 A | * | 10/1994 | Kim .......... | 438/465 |
| 6,624,522 B2 | | 9/2003 | Standing et al. | |
| 7,511,379 B1 | * | 3/2009 | Flint, Jr. .......... | 257/774 |
| 7,569,421 B2 | * | 8/2009 | Do et al. .......... | 438/113 |
| 2002/0014661 A1 | * | 2/2002 | Okamoto et al. .......... | 257/347 |
| 2008/0157303 A1 | * | 7/2008 | Yang .......... | 257/676 |
| 2008/0230922 A1 | * | 9/2008 | Mochizuki et al. .......... | 257/777 |
| 2009/0032871 A1 | | 2/2009 | Vervoort et al. | |

FOREIGN PATENT DOCUMENTS

DE 102005026098 B3 1/2007

OTHER PUBLICATIONS

Brunnbauer, Markus et al., "Embedded Wafer Level Ball Grid Array (eWLB)", IEEE, Electronics Packaging Technology Conference, 2006.

* cited by examiner

*Primary Examiner*—Scott B Geyer
(74) *Attorney, Agent, or Firm*—Dicke, Billig & Czaja, PLLC

(57) ABSTRACT

A semiconductor device and manufacturing method. One embodiment provides at least two semiconductor chips. A dielectric material is applied to the at least two semiconductor chips to attach the at least two semiconductor chips to each other. A portion of the dielectric material is selectively removed between the at least two semiconductor chips to form at least one recess in the dielectric material. Metal particles including paste is applied to the at least one recess in the dielectric material.

21 Claims, 16 Drawing Sheets

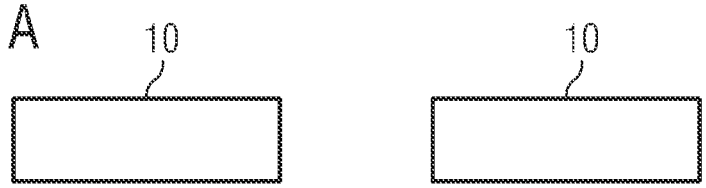
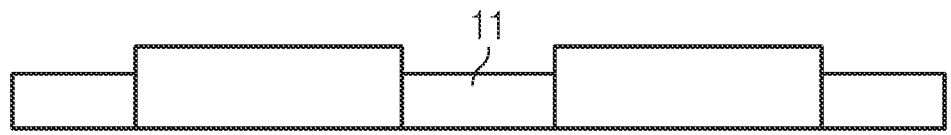
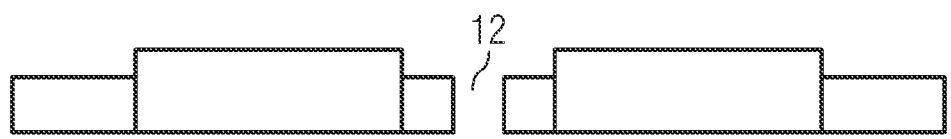
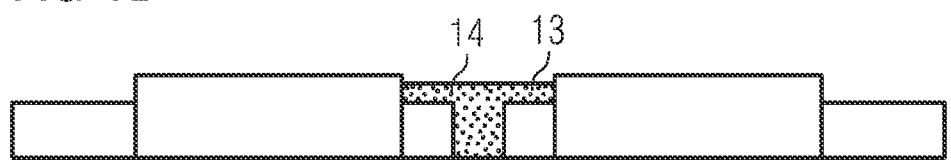
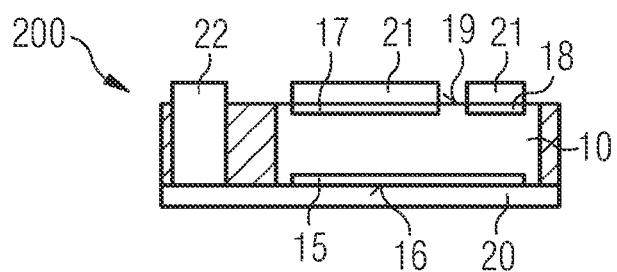

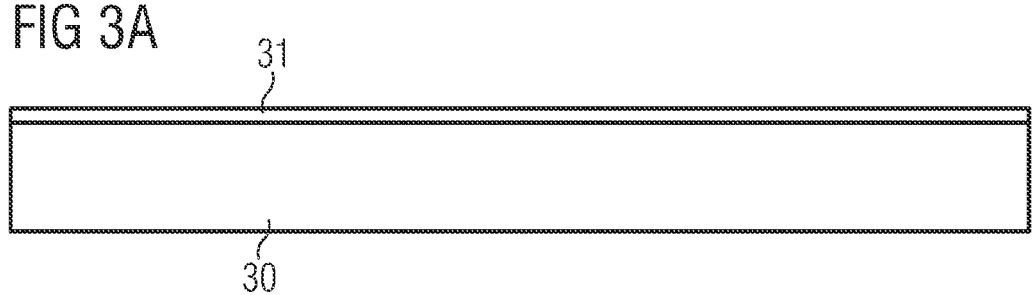
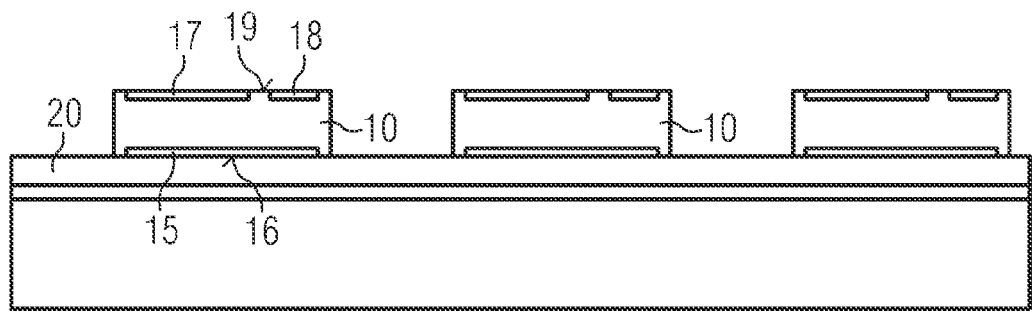

US 7,767,495 B2

METHOD FOR THE FABRICATION OF SEMICONDUCTOR DEVICES INCLUDING ATTACHING CHIPS TO EACH OTHER WITH A DIELECTRIC MATERIAL

BACKGROUND

This invention relates to an electronic device and a method of manufacturing an electronic device.

Market demand for smaller and more functional electronic devices has driven the development of semiconductor devices, including semiconductor packages, and entire systems disposed on a chip. Some electronic devices, such as cellular telephones, employ a variety of design-specific electronic components. The space available inside the electronic devices is limited, particularly as the electronic devices are made smaller. Other electronic devices, such as are employed in the automotive industry, are power devices that operate in demanding environments.

Both the manufacturers and the consumers of electronic devices desire devices that are reduced in size and yet have increased device functionality.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A to 1D schematically illustrate one embodiment of a method to produce a device.

FIG. 2 schematically illustrates one embodiment of a device.

FIGS. 3A to 3K schematically illustrate one embodiment of a method to produce a device.

DETAILED DESCRIPTION

Figure 3D:
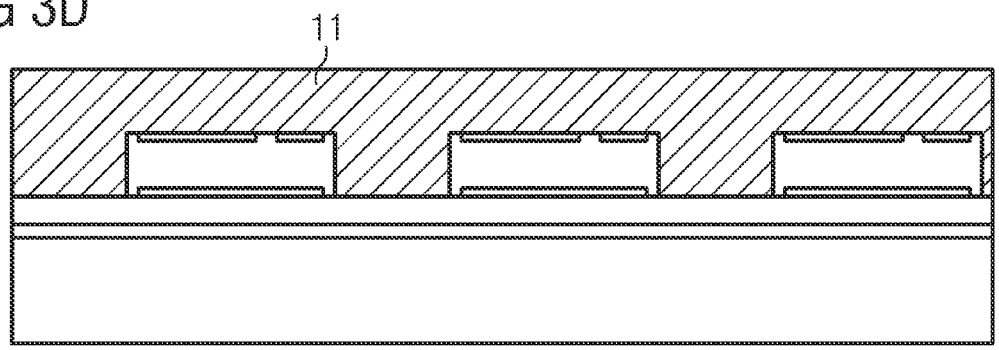
Figure 3E:
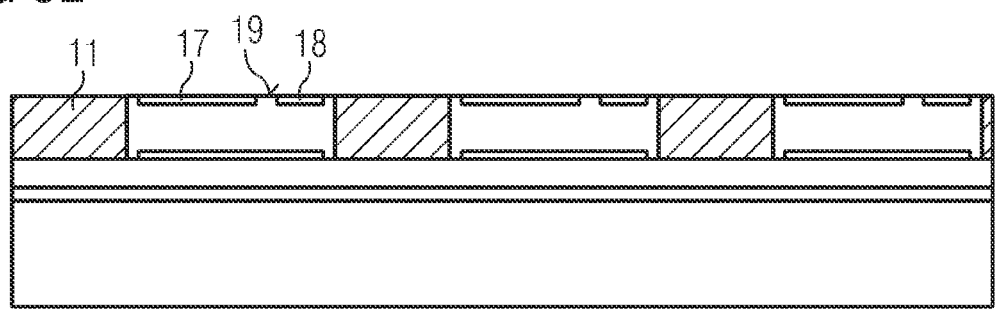

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices with semiconductor chips are described below. The semiconductor chips may be of different types, may be manufactured by different technologies and may include for example integrated electrical, electro-optical or electromechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements in one embodiment on its two main faces, that is to say on its top side and bottom side. In one embodiment, power semiconductor chips may have a vertical structure. By way of example, the source electrode and gate electrode of a power MOSFET may be situated on one main face, while the drain electrode of the power MOSFET is arranged on the other main face. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main faces of the semiconductor chips or on other faces of the semiconductor chips.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material. Solder material, such as solder balls or solder bumps, may be deposited on the external contact elements.

The semiconductor chips or at least parts of the semiconductor chips may be covered with a dielectric material, which may be electrically insulating. The dielectric material may, for example, be an encapsulating material and may be made of any appropriate duroplastic, thermoplastic or thermosetting material or laminate (prepreg). The dielectric material may contain filler materials. After its deposition the dielectric material may be only partially hardened and may be completely hardened after a heat treatment. Various techniques may be employed to cover the semiconductor chips with the dielectric material, for example compression molding, injection molding, powder molding, liquid molding, dispensing or laminating.

The dielectric material may be used to produce fan-out type packages. In a fan-out type package at least some of the external contact elements and/or conductor tracks connecting the semiconductor chip to the external contact elements are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

Portions of the dielectric material may be removed, for example in order to create one or more recesses, through-holes or trenches in the dielectric material. Removing the dielectric material may be carried out by using a laser beam or a water jet, mechanical sawing using a saw or a cutter, chemical etching, milling or any other appropriate method. In the recesses, through-holes or trenches electrically conductive material may be deposited, for example in order to create one or more through-connections. The through-connections may extend from a first face of the dielectric material to a second face of the dielectric material. The through-connections are electrically conductive and may electrically couple an electrically conductive layer on the first face to an electrically conductive layer on the second face of the dielectric material. The through-connections may, for example, be vias (vertical interconnect access).

The recesses, through-holes or trenches may, for example, be filled with a paste containing metal particles. The metal particles may, for example, be made of silver, gold, copper, tin or nickel. The extensions (average diameter) of the metal particles may be smaller than 100 nm and, in one embodiment, smaller than 50 nm or 10 nm. It may also be provided that only a fraction of the metal particles has such dimensions. For example, at least 10% or 20% or 30% or 40% or 50% or 60% or 70% of the metal particles may have dimensions smaller than 100 nm or 50 nm or 10 nm. The other metal particles may have larger dimensions. Apart from the recesses, through-holes and trenches, the metal particles may be deposited onto any other surface of the device.

The metal particles may be coated with a layer of an organic material or a flux material, for example colophony. Furthermore, the metal particles may be dispersed in a suitable liquid or solvent. After their application, the metal particles may be heated and thereby sintered.

One or more metal layers may be placed over the dielectric material and/or the semiconductor chips. The metal layers may, for example, be used to produce a redistribution layer. The metal layers may be used as wiring layers to make electrical contact with the semiconductor chips from outside the devices and/or to make electrical contact with other semiconductor chips and/or components contained in the devices. The metal layers may be manufactured with any desired geometric shape and any desired material composition. The metal layers may, for example, be composed of conductor tracks, but may also be in the form of a layer covering an area. Any desired metal, for example aluminum, nickel, palladium, silver, tin, gold or copper, or metal alloys may be used as the material. The metal layers need not be homogenous or manufactured from just one material, that is to say various compositions and concentrations of the materials contained in the metal layers are possible. Furthermore, the metal layers may be arranged above or below or between electrically insulating layers.

FIGS. 1A to 1D schematically illustrate a method for manufacturing a device. Firstly, at least two semiconductor chips 10 are provided (see FIG. 1A). A dielectric material 11 is applied to the semiconductor chips 10 in order to attach the semiconductor chips 10 to each other (see FIG. 1B). A portion of the dielectric material 11 is selectively removed between the semiconductor chips 10 in order to form at least one recess 12 in the dielectric material 11 (see FIG. 1C). A paste 13 containing metal particles 14 is applied to the recess 12 in the dielectric material 11 (see FIG. 1D).

FIG. 2 schematically illustrates a device 200 in cross section. The device 200 includes a semiconductor chip 10, which has a first contact element 15 on a first face 16 of the semiconductor chip 10 as well as a second contact element 17 and a third contact element 18 on a second face 19 of the semiconductor chip 10 opposite to the first face 16. A first metal layer 20 is applied to the first face 16 of the semiconductor chip 10. A second metal layer 21 may be applied to the second face 19 of the semiconductor chip 10. An interconnect element 22 extends from the first metal layer 20 toward the second face 19 of the semiconductor chip 10. The interconnect element 22 includes sintered metal particles.

Figure 3F:
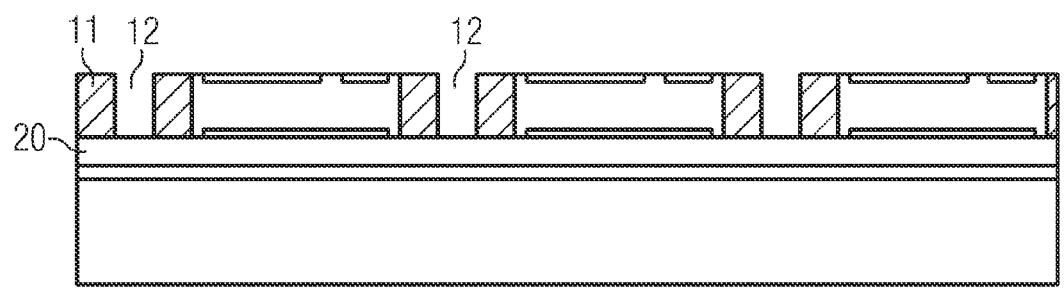
Figure 3G:
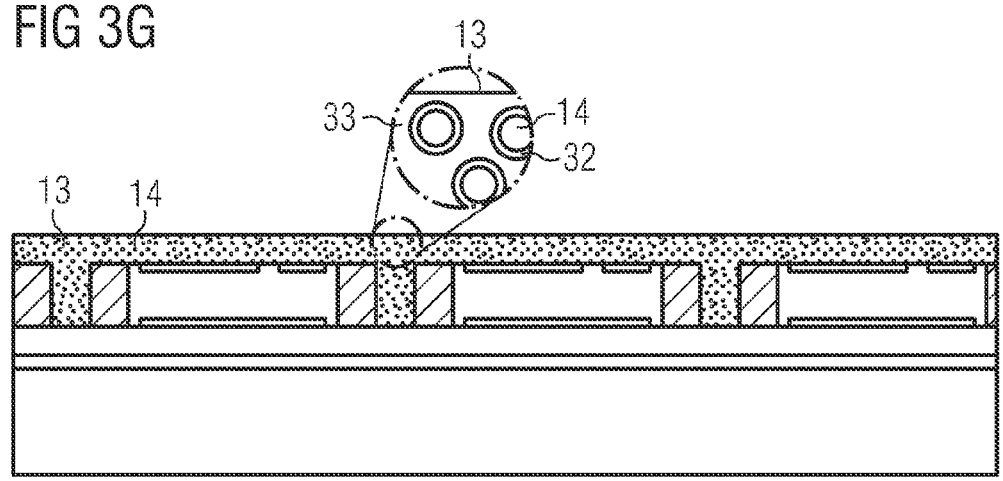
Figure 3H:
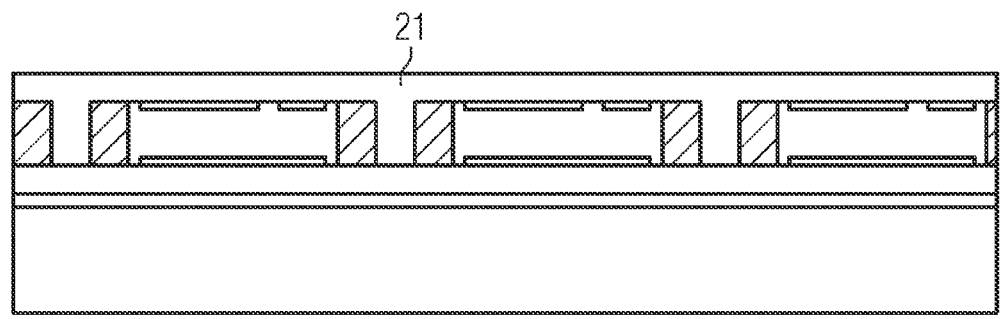
Figure 3I:
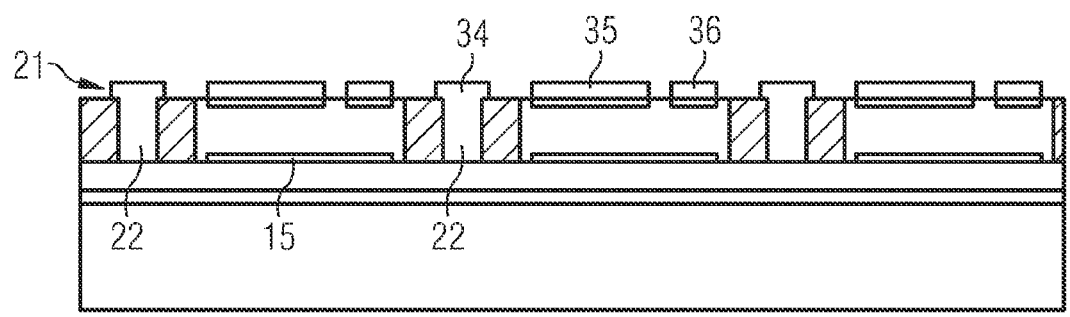
Figure 3J:
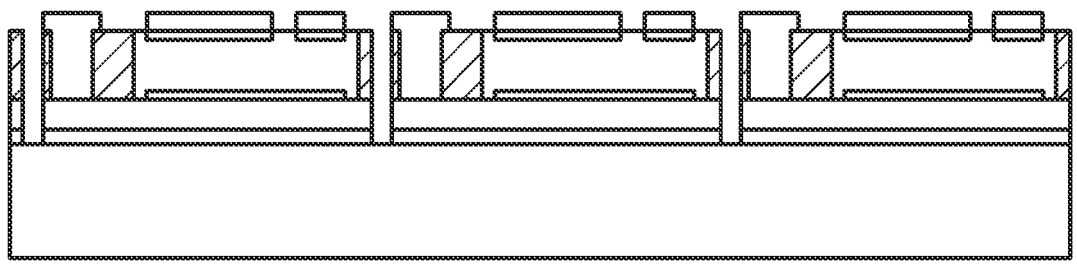
Figure 3K:
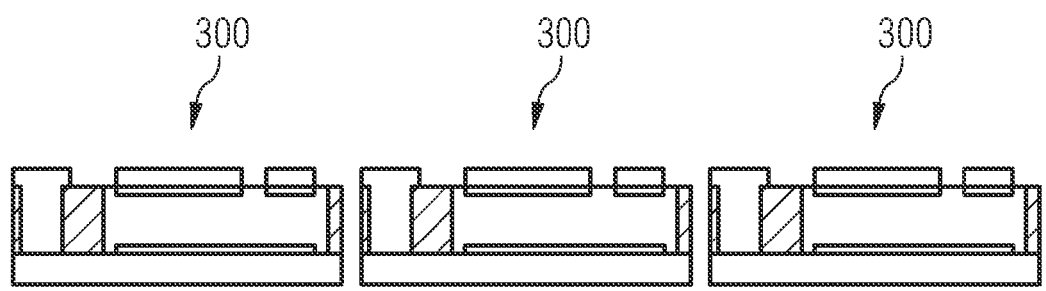

FIGS. 3A to 3K schematically illustrate a method for manufacturing a device 300, a cross section of which is illustrated in FIG. 3K. The method illustrated in FIGS. 3A to 3K is an implementation of the method illustrated in FIGS. 1A to 1D. The details of the production method that are described below can therefore be likewise applied to the method of FIGS. 1A to 1D. Furthermore, the device 300 is an implementation of the device 200. The details of the device 300 that are described below can therefore be likewise applied to the device 200.

In order to manufacture the device 300, a carrier 30 may be provided as illustrated in FIG. 3A. The carrier 30 may be a plate made of a rigid material, for example a metal, such as nickel, steel or stainless steel, laminate, film, glass or a material stack. The carrier 30 may have at least one flat surface on which components of the device 300 can be placed. The shape of the carrier 30 is not limited to any geometric shape, for example the carrier 30 may be round or square-shaped. The carrier 30 may have any appropriate size. An adhesive tape 31, for example a double sided sticky tape, may be laminated onto the carrier 30.

A metal layer 20 may be deposited onto the adhesive tape 31 as illustrated in FIG. 3B. The thickness of the metal layer 20 may be in the range from 10 μm to 1 mm or may be even thicker. Furthermore, the metal layer 20 may be structured. The metal layer 20 may be made from copper, aluminum or any other appropriate metal or metal alloy. When deposited the metal layer 20 may have the form of a foil which is fixed on the adhesive tape 31. For attaching the metal foil 20 to the carrier 30, other kinds of attaching materials may be used. The metal foil 20 may be plated with an electrically conductive material, for example copper, silver, iron nickel or nickel phosphorus.

It may be provided that the thickness of the metal layer 20 is increased after its release from the carrier 30 which is described further below. Increasing the thickness of the metal layer 20 may, for example, be carried out by galvanic deposition of electrically conductive material, for example copper. The deposition of the electrically conductive material may, in one embodiment, be carried out if the metal layer 20 has a thickness of less than 50 μm.

As illustrated in FIG. 3C, at least two semiconductor chips 10 as well as possibly further semiconductor chips and/or components are placed over the metal layer 20. Any suitable array of the semiconductor chips 10 may be placed on the metal layer 20 (only three of the semiconductor chips 10 are illustrated in FIG. 3C).

The semiconductor chips 10 as well as all other semiconductor chips described herein may have been fabricated on a wafer made of semiconductor material. After dicing the wafer and thereby separating the individual semiconductor chips 10, the semiconductor chips 10 are relocated on the carrier 30 in larger spacing as they have been in the wafer bond. The semiconductor chips 10 may have been manufactured on the same semiconductor wafer, but may have been manufactured on different wafers. Furthermore, the semiconductor chips 10 may be physically identical, but may also contain different integrated circuits and/or represent other components. The thickness of the semiconductor chips 10 may be in the range from 20 μm to some hundred micrometer.

The semiconductor chips 10 may have a first electrode 15 on a first face 16 and second and third electrodes 17 and 18 on a second face 19 that is opposite to the first face 16. The semiconductor chips 10 may be power semiconductor chips, for example IGBTs, vertical power diodes or vertical power transistors, such as power MOSFETs. In the latter case, which is exemplarily illustrated in FIG. 3C, the first and second electrodes 15 and 17 may be drain and source electrodes (load electrodes), respectively. The third electrode 18 may function as a gate terminal (control electrode) in the case the semiconductor chips 10 are power MOSFETs. During operation, voltages of up to 5, 50, 100, 500 or 1000 V or even higher may be applied between the load electrodes 15 and 17. The switching frequency applied to the control electrode 18 may be in the range from 1 kHz to 1 MHz, but may also be outside this range.

The semiconductor chips 10 may be mounted on the carrier 30 with their first faces 16 facing the planar top surface of the metal layer 20. The drain electrodes 15 may be electrically coupled to the metal carrier 20. The electrical connections between the drain electrodes 15 of the semiconductor chips 10 and the metal layer 20 may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the metal layer 20 and the respective semiconductor chip 10 on account of interface diffusion processes. In this case, the use of Sn, AuSn, AgSn, CuSn, AgIn, AuIn, CuIn, AuSi or Au solders is conceivable. If the semiconductor chips 10 are adhesively bonded to the metal layer 20, it is possible to use electrically conductive adhesives which may be based on epoxy resins and be enriched with gold, silver, nickel or copper in order to produce the electrical conductivity.

After the semiconductor chips 10 have been mounted on the carrier 30, they are covered with a dielectric material 11 thereby forming a layer of the dielectric material 11 as illustrated in FIG. 3D. The dielectric material 11 may be an encapsulating material including polymers or polymer composites. For example, the dielectric material 11 may be a duroplastic or thermosetting mold material. The gaps between the semiconductor chips 10 are also filled with the mold material 11. The mold material 11 may be based on an epoxy material and may contain a filling material consisting of small particles of glass ($SiO_2$) or other electrically insulating mineral filler materials like $Al_2O_3$ or organic filler materials. Compression molding, injection molding, powder molding, liquid molding or other appropriate molding techniques or other casting techniques may be employed to apply the mold material 11. The thickness of the layer of the mold material 11 over the metal layer 20 may be in the range from 200 to 1000 μm, but may also be outside this range. The mold material 11 covering the second faces 19 of the semiconductor chips 10 may have a thickness greater than 150 μm.

As an alternative to the mold material, another polymer or polymer composite may be used as the dielectric material 11 to cover the semiconductor chips 10 and the metal layer 20. The dielectric material 11 may, for example, have the shape of an electrically insulating foil or sheet, which is laminated on top of the semiconductor chips 10 and the metal layer 20. Heat and pressure may be applied for a time suitable to attach the polymer foil or sheet 11 to the underlying structure. The gaps between the semiconductor chips 10 are also filled with the polymer material 11. The polymer material 11 may, for example, be a prepreg (short for preimpregnated fibers) that is a combination of a fiber mat, for example glass or carbon fibers, and a resin, for example a duroplastic material. Prepreg materials are usually used to manufacture PCBs (printed circuit boards). Well known prepreg materials that are used in PCB industry and that can be used here as the polymer material 11 are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 10 and hardened during a heat-treatment. For the lamination of the prepreg the same or similar processes can be used as in PCB manufacturing.

The layer of the dielectric material 11 may be thinned (see FIG. 3E) by mechanically removing the dielectric material 11 from its upper surface. Grinding machines may be used that are similar or identical to the machines used for semiconductor wafer grinding. Instead of grinding, milling or polishing, such as chemical mechanical polishing, may be used to reduce the thickness of the layer of the dielectric material 11.

Thinning may be carried out until the electrodes 17 and 18 of the semiconductor chips 10 are exposed. It is also possible that the heights of the semiconductor chips 10 are reduced when thinning the layer of the dielectric material 11. As a result of the thinning, the surface of the layer of the dielectric material 11 facing away from carrier 30 is flush with the second faces 19 of the semiconductor chips 10. The term "flush" is here not meant mathematically and may include micro-processes in the range up to several micrometers. Thus, the upper surface of the layer of the dielectric material 11 and the electrodes 17 and 18 form a common planar surface. Other layers, for example a redistribution layer, can be applied to this planar surface.

The dielectric material 11 may be structured as illustrated in FIG. 3F. A plurality of recesses 12 (or cutouts or through-holes or trenches) are created in the dielectric material 11 to expose at least portions of the upper surface of the metal layer 20 so that electrical connections can be made to those exposed regions. Removing the dielectric material 11 may be carried out by using a laser beam or a water jet, mechanical sawing using a saw or a cutter, chemical etching, milling or any other appropriate method. If the dielectric material 11 includes photo-active components, the dielectric material 11 may also be photo-lithographically structured. The widths of the recesses 12 may, for example, be in the range from 20 to 200 µm.

At least some of the recesses 12 may be formed in the spacings between two adjacent semiconductor chips 10. The recesses 12 may be formed such that the side faces of the semiconductor chips 10 are still coated with the dielectric material 11. In the embodiment illustrated in FIG. 3F, one recess 12 is formed in every spacing. In one embodiment, two or more recesses 12 may be formed between two adjacent semiconductor chips 10 as described further below in connection with FIG. 10H.

A paste 13 containing metal particles 14 may be deposited in the recesses 12 and on the top planar surface of the dielectric material 11 and the semiconductor chips 10 as illustrated in FIG. 3G. The metal particles 14 may, for example, be made of copper, silver, gold, tin or nickel or a metal alloy. According to one embodiment, the metal particles 14 may be made of a pure metal. The extensions (average diameter) of the metal particles 14 may be smaller than 100 nm and, in one embodiment, smaller than 50 nm or 10 nm. It may also be provided that only a fraction of the metal particles 14, which are used to manufacture the devices 300, has such dimensions. For example, at least 10% or 20% or 30% or 40% or 50% or 60% or 70% of the metal particles 14 may have dimensions smaller than 100 nm or 50 nm or 10 nm. The other metal particles 14 may have larger dimensions.

The metal particles 14 may be coated with a layer 32 of an organic material or a flux material, for example colophony (see the enlarged part in FIG. 3G). Furthermore, the metal particles 14 are dispersed in a suitable liquid or solvent 33. The paste 13 containing the metal particles 14 may be fluid, viscous or waxy. Pastes 13 containing metal particles 14, which are coated with a layer 32 of an organic or flux material and dispersed in a liquid 33, can, for example, be purchased from the companies Coocson Electronic (product name: N 1000), Advanced Nano-Particles (ANP), Harima Chemicals (product names: NPS-H and NHD-1) or NBE Technologies (product name: NBE Tech). Other products from these or other companies may be used and may serve the same purpose as described below.

The application of the paste 13 containing the metal particles 14 dispersed in the liquid 33 may be performed by stencil printing, screen printing, ink jet printing or other printing technologies. Moreover, the paste 13 may be distributed by a squeegee. Other techniques for the application of the paste 13 are also possible, for example dispensing or spin-coating.

One of the tasks of the liquid 33 may be to enable the metal particles 14 to be applied to the exposed surface of the device 300. Therefore, the liquid 33 may be chosen such that—depending on the application technique—it is fluid, viscous or waxy during the application of the paste 13.

After the application of the paste 13, the paste 13 may be exposed to a temperature, which may be in the range from 100 to 300° C. and in one embodiment in the range from 100 to 200° C. This temperature process causes the liquid 33 to evaporate without any residues and the layers 32 coating the metal particles 14 to sublimate or evaporate. Furthermore, the applied temperature may be lower than the melting temperature of the metal (when provided in macroscopic dimensions) of which the metal particles 14 are made. Due to the temperature step, the metal particles 14 may sinter and may thus form a solid metal layer 21 as illustrated in FIG. 3H. The exposure time to the sinter temperature may be arbitrary, in one embodiment it may be long enough to allow the liquid 33 to evaporate and the metal particles 14 to sinter. For producing the sintered metal layer 21, the carrier 30 may be heated by a hot plate or may be placed in an oven. The sintered metal layer 21 may be of any thickness, in one embodiment its thickness may be in the range from 1 to 100 µm. Pores may be distributed over the sintered metal layer 21.

The sinter temperature may depend on the material of the metal particles 14 and their sizes. The smaller the sizes of the metal particles 14, the lower the sinter temperature may be. Thus, the sinter temperature may be reduced by reducing the diameters or dimensions of the metal particles 14. The sinter temperature may be that low that it does not affect or damage the other components of the device 300, in one embodiment the dielectric material 11.

The layers 32 coating the metal particles 14 may prevent oxidation of the metal particles 14. If an outer layer of the metal particles 14 is oxidized, a higher temperature would be required to sinter the metal particles 14. Moreover, the layers 32 coating the metal particles 14 may prevent premature agglomeration of the metal particles 14.

As illustrated in FIG. 3I, the sintered metal layer 21 may be structured in order to electrically insulate the drain, source and gate electrodes 15, 17 and 18 of the semiconductor chips 10 from each other. Structuring the sintered metal layer 21 may be carried out by photolithographic methods, etching methods and/or laser techniques. By structuring the sintered metal layer 21, external contact pads 34, 35 and 36 are created, which are accessible from outside the device 300 and thus allow electrical contact to be made with the drain, source and gate electrodes 15, 17 and 18, respectively, from outside the device 300. The external contact pads 34 to 36 are arranged in one plane. Due to the sintered metal particles 14 in the recesses 12, interconnect elements 22 are formed, which extend from the metal layer 20 toward the second face 19 of the semiconductor chips 10. The interconnect elements 22 electrically couple the drain electrodes 15 to the external contact pads 34.

Solder deposits may be placed onto the external contact pads 34 to 36 (not illustrated). The solder deposits may be applied to the external contact pads 34 to 36 by "ball placement", in which pre-shaped balls composed of solder material are applied to the external contact pads 34 to 36. As an alternative to "ball placement", the solder deposits may, for example, be applied by using stencil printing with a solder paste, followed by a heat-treatment process. The solder material may, for example, be composed from at least one of the following materials: SnPb, SnAg, SnAgCu, SnAgCuNi, SnAu, SnCu and SnBi. The solder deposits may be used as external contact elements to electrically couple the device 300 to other components.

As illustrated in FIG. 3J, the devices 300 are separated from one another by separation of the dielectric material 11 and the metal layer 20, for example by sawing, cutting, milling, etching or a laser beam.

The devices 300 are released from the carrier 30, and the adhesive tape 31 is pealed from the metal layer 20 as illustrated in FIG. 3K. The adhesive tape 31 may feature thermo-release properties, which allow the removal of the adhesive tape 31 during a heat-treatment. The removal of the adhesive tape 31 from the carrier 30 is carried out at an appropriate temperature, which depends on the thermo-release properties of the adhesive tape 31 and should be higher than the sinter temperature of the metal particles 14. The temperature is usually higher than 150° C.

It is obvious to a person skilled in the art that the device 300 illustrated in FIG. 3K and the manufacturing thereof as described above are only intended to be an exemplary embodiment, and many variations are possible. For example, more than one semiconductor chip or passives of different types may be included in the same device 300. The semiconductor chips and passives may differ in function, size, manufacturing technology etc.

Furthermore, the semiconductor chips 10 may be mounted onto the metal layer 20 with their second faces 19 facing the metal layer 20. In this case, the metal layer 20 may be structured at one point during the manufacturing process.

Figure 4:
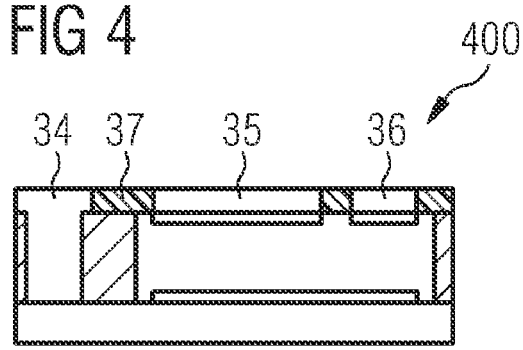
FIG. 4 schematically illustrates one embodiment of a device.

It may also be provided that after structuring the sintered metal layer 21, the gaps between the external contact pads 34 to 36 are filled with a dielectric material 37. Such a device 400 is schematically illustrated in FIG. 4. The dielectric material 37 may, for example, be a mold material applied by an appropriate molding process or a foil applied by lamination. During the manufacturing process the devices 400 are singulated after the application of the dielectric material 37.

The devices 300 manufactured by the method described above may be fan-out type packages. The layer of the dielectric material 11 allows the external contact pads 34 to 36 to extend beyond the outline of the semiconductor chip 10. The external contact pads 34 to 36 therefore do not need to be arranged within the outline of the semiconductor chip 10, but can be distributed over a larger area. The increased area which is available for arrangement of the external contact pads 34 to 36 as a result of the layer of the dielectric material 11 means that the external contact pads 34 to 36 cannot only be arranged at a great distance from one another, but that the maximum number of external contact pads 34 to 36 which can be arranged there is likewise increased compared to the situation when all the external contact pads 34 to 36 are arranged within the outline of the semiconductor chips 10.

Figure 5:
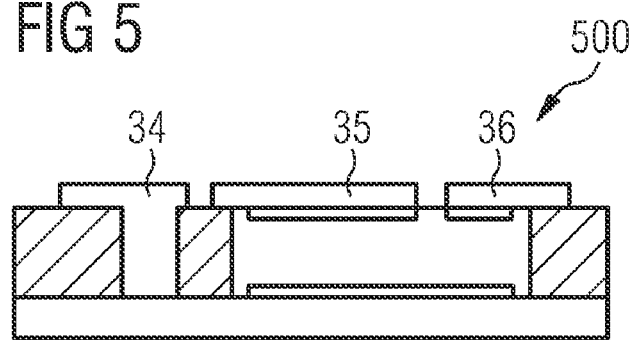
FIG. 5 schematically illustrates one embodiment of a device.

It is to be noted that FIG. 3K illustrates only an example of how the external contact pads 34 to 36 may be shaped and arranged. It may be provided that the external contact pads 34 to 36 are shaped and arranged in any other way. The surface areas of the external contact pads 34 to 36 may be larger than the surface areas of the corresponding electrodes 15, 17 and 18. Furthermore, their shapes may be different. In other words, the side of the device 300 where the external contact pads 34 to 36 are located may have any desired footprint for external connections. This way, footprint geometry and chip contact geometry are decoupled from each other. Furthermore, it is to be noted that the external contact pads 35 and 36, which are electrically coupled to the electrodes 17 and 18, may extend beyond the semiconductor chip 10 and may be arranged at least partially outside of a region defined by the contour of the semiconductor chip 10. Exemplarily, a device 500 is schematically illustrated in FIG. 5 having a footprint geometry which is different from the footprint geometry of the device 300.

The exposed surfaces of the external contact pads 34 to 36 may be used to electrically couple the device 300 to other components. This is exemplarily illustrated in FIG. 6. There, an excerpt of a device 600 is schematically illustrated which includes the device 300 that is mounted onto a circuit board 40, for example a PCB (Printed Circuit Board). Solder deposits 41 are used to solder the external contact pads 34 to 36 to contact pads 42 of the circuit board 40.

On top of the device 300, a heat sink or cooling element 43 may be attached. The heat sink or cooling element 43 may be electrically insulated from the metal layer 20 by an electrically insulating layer 44. In one embodiment, the electrically insulating layer 44 may also be omitted in case the voltages applied to the metal layer 20 are rather low. During operation, the thermal conductivity of the metal layer 20 allows to transfer the heat generated by the semiconductor chip 10 to the heat sink or the cooling element 43 where the heat is dissipated. Furthermore, the heat generated by the semiconductor chip 10 can also partially be transferred to the circuit board 40 where it is dissipated.

Figure 7A:
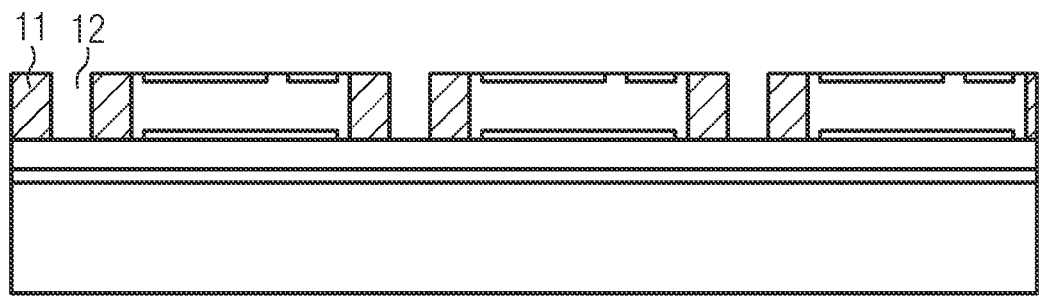
FIGS. 7A to 7C schematically illustrate one embodiment of a method to produce a device.
Figure 7B:
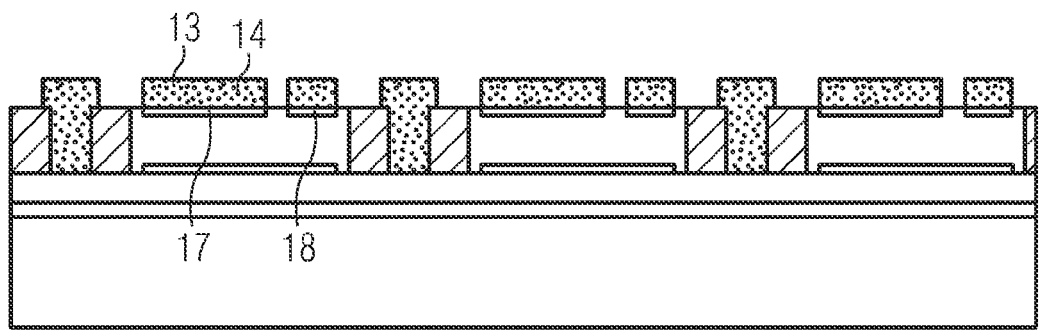
Figure 7C:
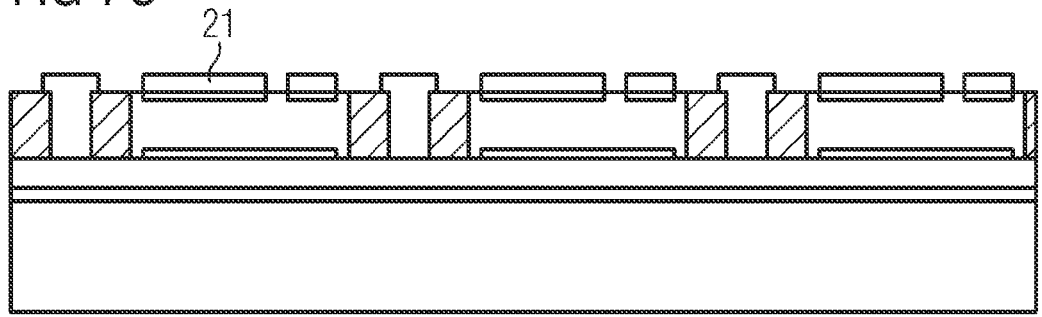

A variation of the manufacturing method illustrated in FIGS. 3F to 3I is schematically illustrated in FIGS. 7A to 7C. After the formation of the recesses 12 in the dielectric material 11 (see FIG. 7A), the paste 13 containing the metal particles 14 is selectively applied to the recesses 12 and the exposed electrodes 17 and 18 of the semiconductor chips 10 as illustrated in FIG. 7B. The selective application of the paste 13 may, for example, be carried out by ink jet printing. After the sintering of the metal particles 14 (see FIG. 7C), the sintered metal layer 21 does not need to be structured.

Figure 8A:
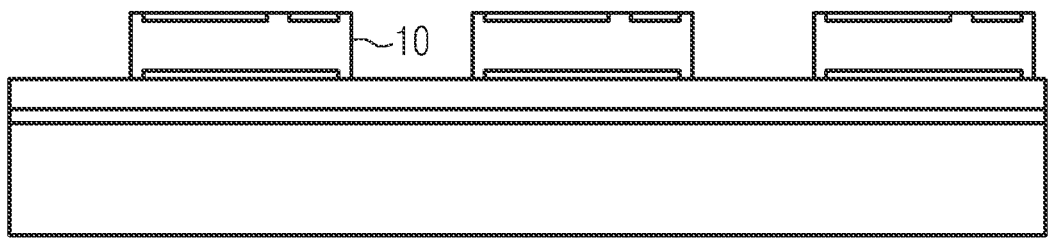
FIGS. 8A to 8C schematically illustrate one embodiment of a method to produce a device.
Figure 8B:
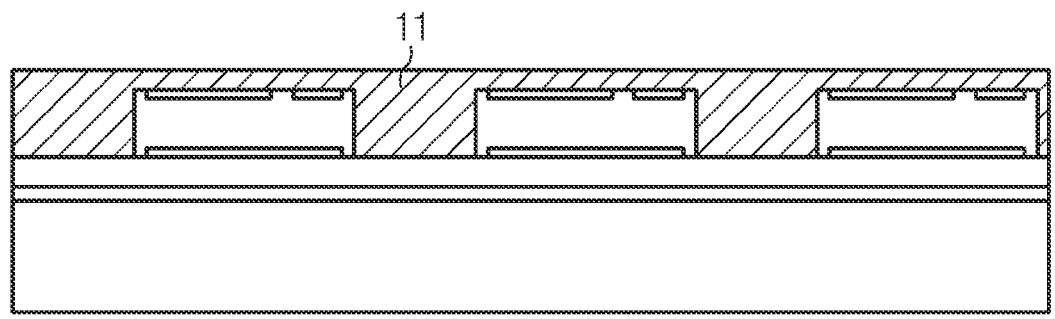
Figure 8C:
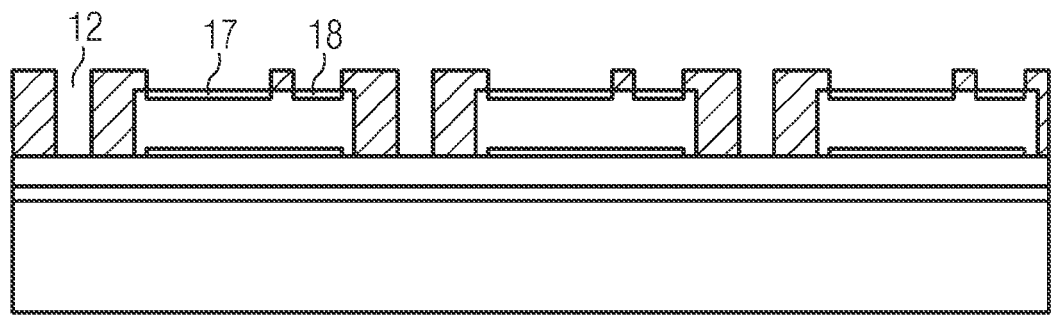

A variation of the manufacturing method illustrated in FIGS. 3C to 3F is schematically illustrated in FIGS. 8A to 8C. There, the semiconductor chips 10 are mounted on the metal layer 20 (see FIG. 8A) and are afterwards encapsulated with the dielectric material 11 (see FIG. 8B). In contrast to FIG. 3E, the entire second face 19 of the semiconductor chips 10 is not opened by grinding, but only the electrodes 17 and 18 are exposed by removing portions of the dielectric material 11 as illustrated in FIG. 8C. Removing the dielectric material 11 may be carried out by using a laser beam or a water jet, mechanical sawing using a saw or a cutter, chemical etching, milling or any other appropriate method.

Figure 9A:
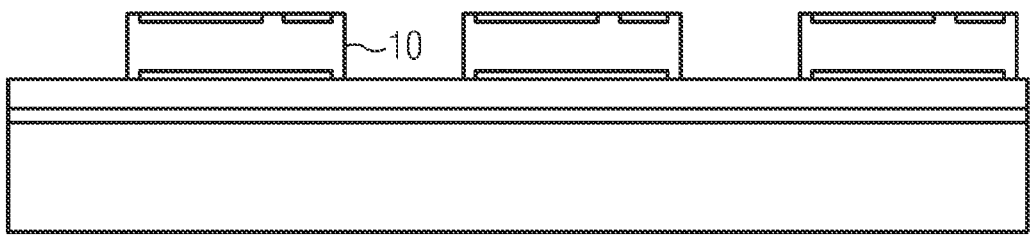
FIGS. 9A to 9C schematically illustrate one embodiment of a method to produce a device.
Figure 9B:
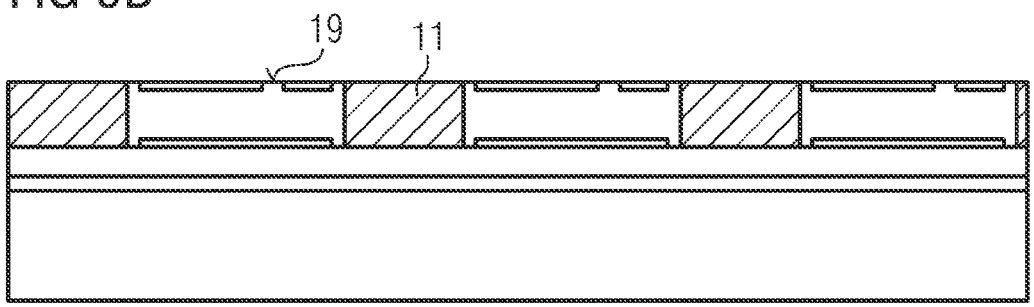
Figure 9C:
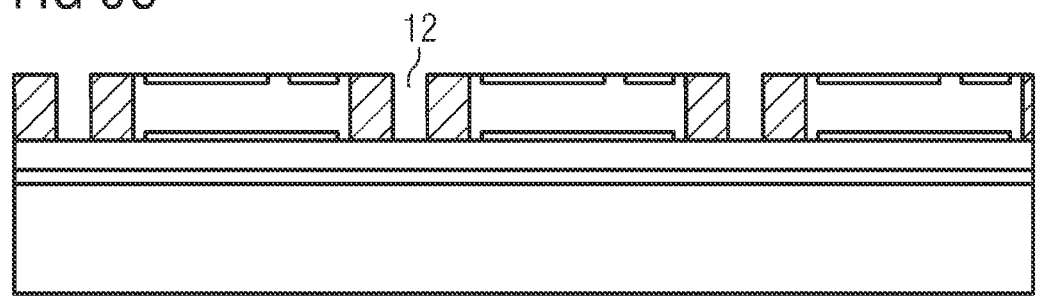

In yet a further variation of the manufacturing method illustrated in FIGS. 3C to 3F, which is schematically illustrated in FIGS. 9A to 9C, the dielectric material 11 is applied such that it does not cover the second faces 19 of the semiconductor chips 10 as illustrated in FIG. 9B. The dielectric material 11 may be applied such that the upper surface of the dielectric material 11 and the second faces 19 of the semiconductor chips 10 form a common planar surface. In this embodiment, the dielectric material 11 does not need to be thinned.

Figure 10A:
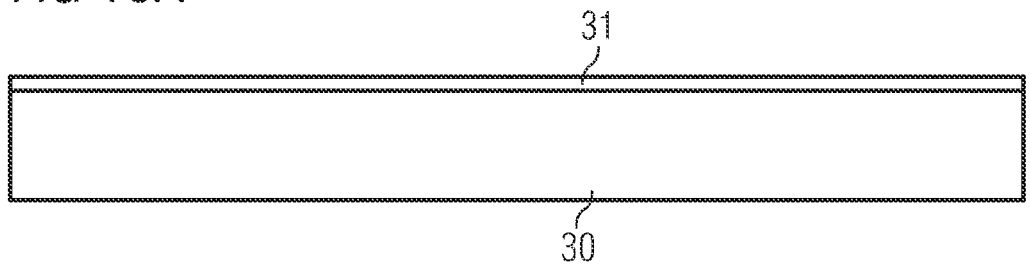
FIGS. 10A to 10N schematically illustrate one embodiment of a method to produce a device.
Figure 10B:
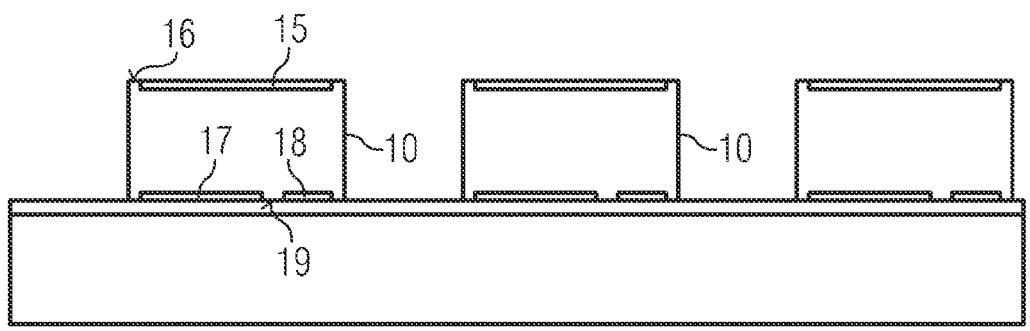
Figure 10C:
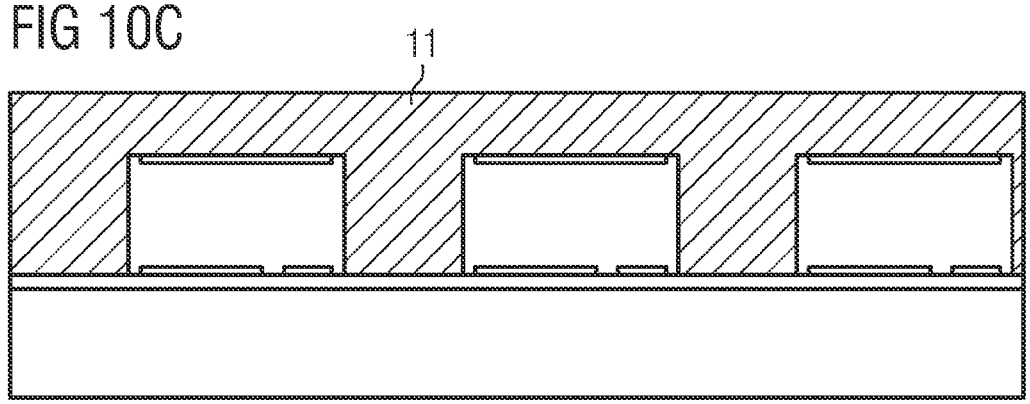
Figure 10D:
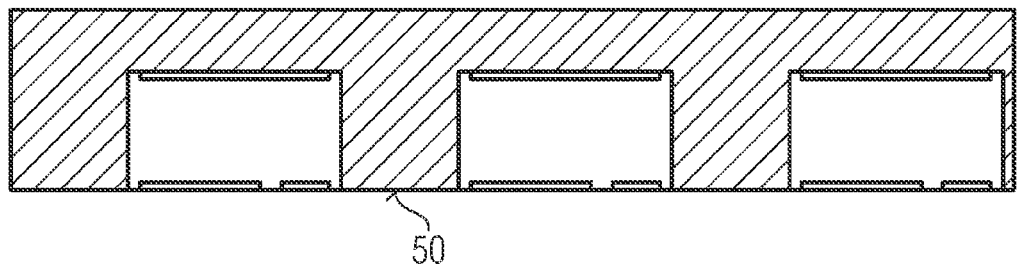
Figure 10E:
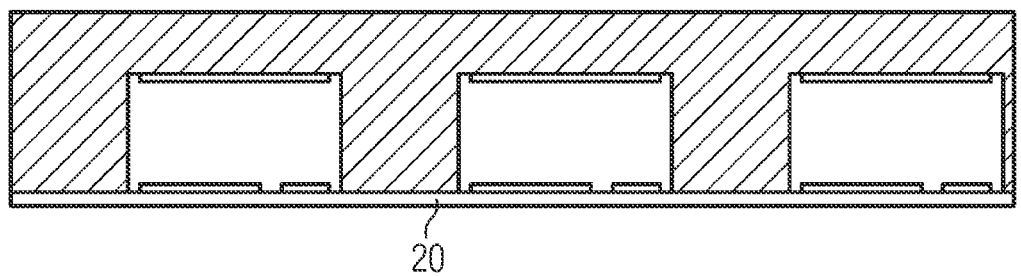
Figure 10F:
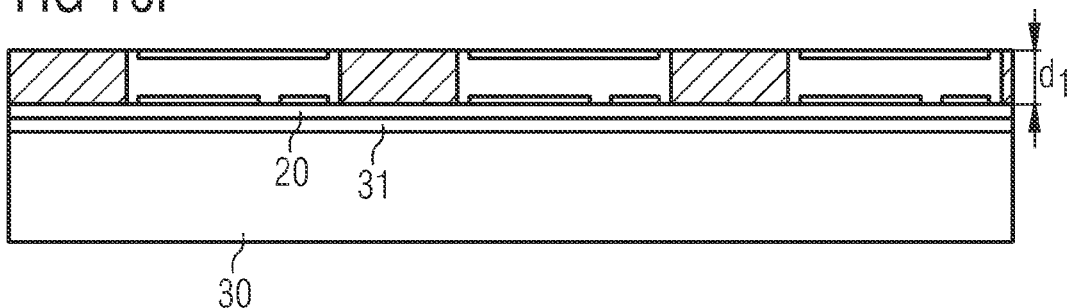
Figure 10G:
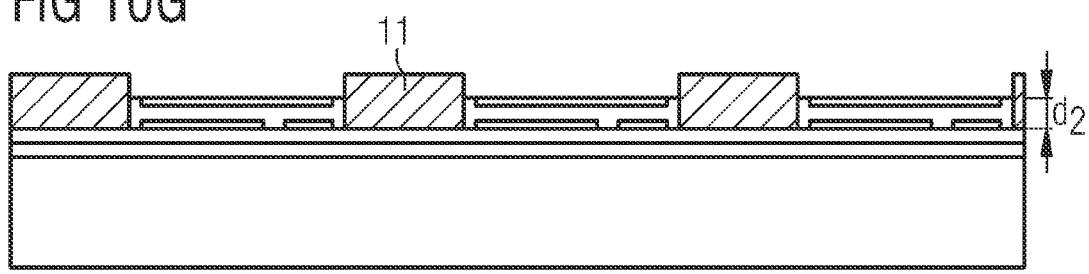
Figure 10H:
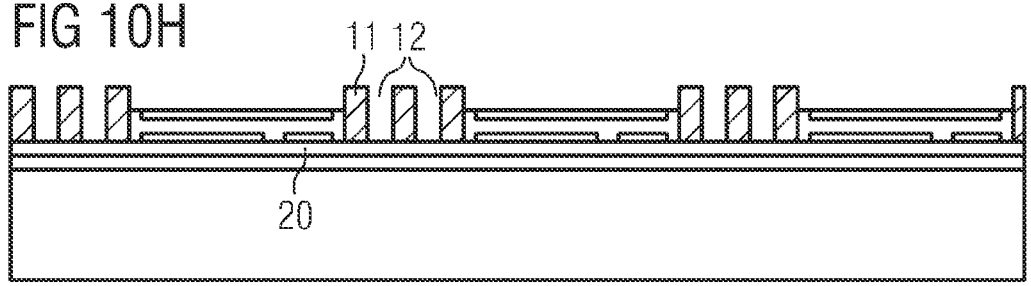
Figure 10I:
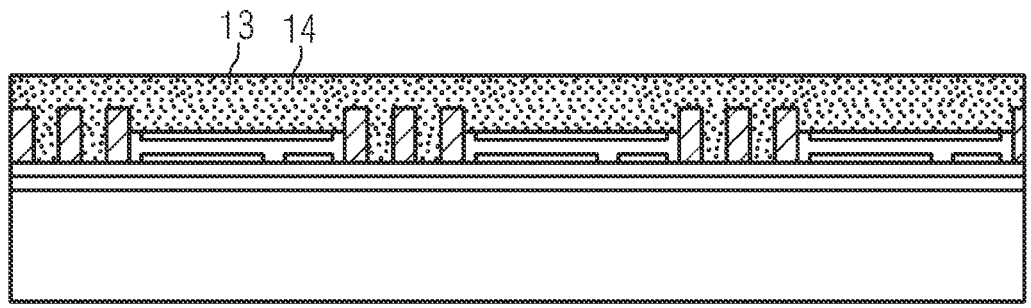
Figure 10J:
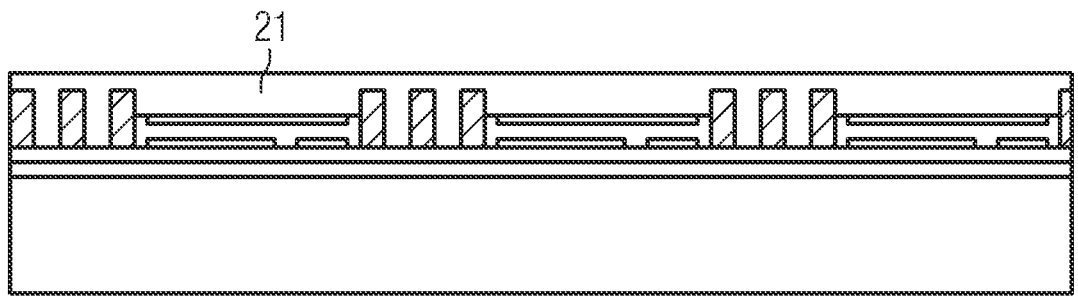
Figure 10K:
Figure 10L:
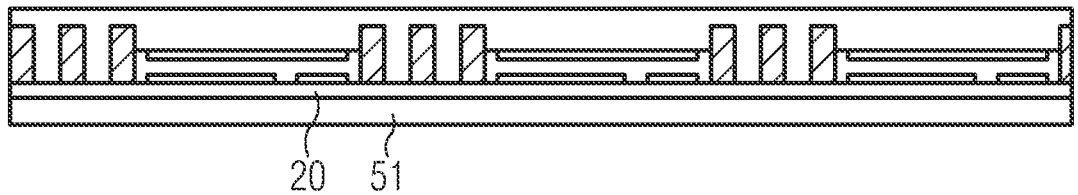
Figure 10M:
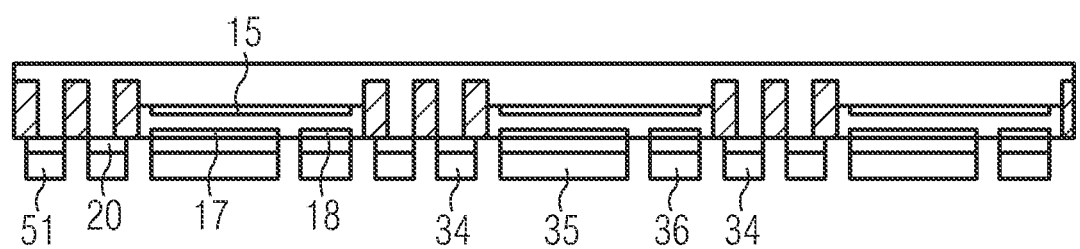
Figure 10N:
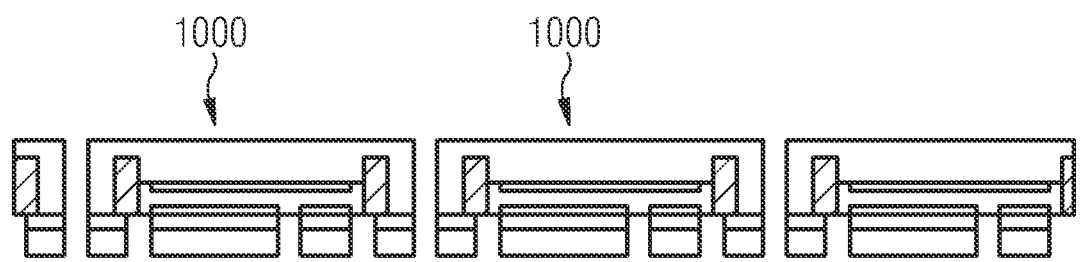

FIGS. 10A to 10N schematically illustrate a method for production of a device 1000, a cross section of which is illustrated in FIG. 10N. The method presented in FIGS. 10A to 10N illustrates some similarities to the method illustrated in FIGS. 3A to 3K. Therefore similar or identical components used in both methods are denoted by the same reference numerals. Furthermore, in the following it is sometimes referred to the method of FIGS. 3A to 3K if the same method processes can be carried out as described above.

As illustrated in FIGS. 10A and 10B, a carrier 30 with an adhesive tape 31 is provided and semiconductor chips 10, which may be power semiconductor chips, are attached to the adhesive tape 31. In the present embodiment, the semiconductor chips 10 are mounted on the carrier 30 with their second faces 19 including the electrodes 17 and 18 facing the carrier 30. Thus, the first faces 16 including the electrodes 15 of the semiconductor chips 10 face away from the carrier 30.

As illustrated in FIG. 10C, the semiconductor chips 10 and the carrier 30 are covered with the dielectric material 11 as described above in connection with FIG. 3D.

The semiconductor chips 10 and the layer of dielectric material 11 are released from the carrier 30 as illustrated in FIG. 10D. The release from the carrier 30 may be carried out by an appropriate heat-treatment in case the adhesive tape 31 features thermo-release properties.

After the release of the carrier 30 and the adhesive tape 31 the second faces 19 of the semiconductor chips 10 and the bottom surface of the dielectric material 11 form a common planar surface 50. As illustrated in FIG. 10E, a metal layer 20 may be applied to the surface 50. The metal layer 20 may be a seed layer having a thickness of less than 1 µm and may be deposited electroless, i.e. electrochemically, or by sputtering. The metal layer 20 may consist of any appropriate metal or metal alloy, such as palladium, titanium, copper, aluminum etc.

The wafer including the semiconductor chips 10, the dielectric material 11 and the metal layer 20 may be placed on a carrier 30 and attached to the carrier 30 by an adhesive tape 31 (see FIG. 10F). The layer of the dielectric material 11 and also the semiconductor chips 10 are then thinned, for example by grinding. Thinning is carried out until the semiconductor chips 10 have the desired thickness $d_1$, which may be in the range from 70 to 350 µm and in one embodiment in the range from 250 to 300 µm.

Chemical etching may be performed as illustrated in FIG. 10G in order to further reduce the thickness of the semiconductor chips 10. The thickness $d_2$ of the semiconductor chips 10 after the etching may be in the range from 1 to 30 µm and in one embodiment from 5 to 10 µm, but may also be outside this range. The etching process may be stopped by an etching stop layer, which may be integrated into the semiconductor chips 10. The etchant may be chosen such that it does not affect the dielectric material 11 meaning that the dielectric material 11 has a thickness $d_1$ after the etching process.

After the chemical etching of the semiconductor chips 10, a metal layer may, for example, be deposited on the top surface of the semiconductor chips 10 (not illustrated in FIG. 10G). Any desired metal or metal alloy, for example aluminum, titanium, gold, silver, copper, palladium, platinum, nickel, chromium or nickel vanadium, may be used as the material. Sputtering, vacuum deposition or any other appropriate technique may be used to deposit the metal layer.

The dielectric material 11 may be structured as illustrated in FIG. 10H. A plurality of recesses 12 are created in the dielectric material 11 to expose at least portions of the upper surface of the metal layer 20 so that electrical connections can be made to those exposed regions. Removing the dielectric material 11 may be carried out by using a laser beam or a water jet, mechanical sawing using a saw or a cutter, chemical etching, milling or any other appropriate method. If the dielectric material 11 includes photo-active components, the dielectric material 11 may also be photo-lithographically structured. The widths of the recesses 12 may, for example, be in the range from 20 to 200 µm. In the embodiment illustrated in FIG. 10H, two recesses 12 are formed in every spacing between two adjacent semiconductor chips 10. In one embodiment, only one recess 12 may be formed between two adjacent semiconductor chips 10 as described above in connection with FIG. 3F.

In FIGS. 10I and 10J the deposition of a paste 13 containing metal particles 14 and the sintering of the metal particles 14 are illustrated. These processes are similar to the processes described above in connection with FIGS. 3G and 3H. It is to be noted that the paste 13 is also deposited on top of the dielectric material 11 so that the sintered metal layer 21 obtained after the sintering process overlaps the dielectric material 11.

After the sintering process the semiconductor chips 10 and the layer of dielectric material 11 are released from the carrier 30 as illustrated in FIG. 10K. The release from the carrier 30 may again be carried out by an appropriate heat-treatment.

The thickness of the metal layer 20 may be increased by depositing a further metal layer 51 onto the metal layer 20 as illustrated in FIG. 10L. For that purpose, the paste 13 including the metal particles 14 may be deposited onto the metal layer 20 and the particles 14 may be sintered. In one embodiment, the metal layer 51 may be galvanically deposited using the metal layer 20 as a seed layer. The metal layer 51 may have any desired thickness in the range from 10 µm to some hundred micrometer.

As illustrated in FIG. 10M, the metal layers 20 and 51 may be structured in order to electrically insulate the drain, source and gate electrodes 15, 17 and 18 of the semiconductor chips 10 from each other. Structuring the metal layers 20 and 51 may be carried out by photolithographic methods, etching methods and/or laser techniques. By structuring the metal layers 20 and 51, external contact pads 34, 35 and 36 are created, which are accessible from outside the device 1000 and thus allow electrical contact to be made with the drain, source and gate electrodes 15, 17 and 18, respectively. Solder deposits may be placed onto the external contact pads 34 to 36 (not illustrated).

As illustrated in FIG. 10N, the devices 1000 are separated from one another by separation of the dielectric material 11 and the metal layer 21, for example by sawing, cutting, milling, etching or a laser beam.

Figure 6:
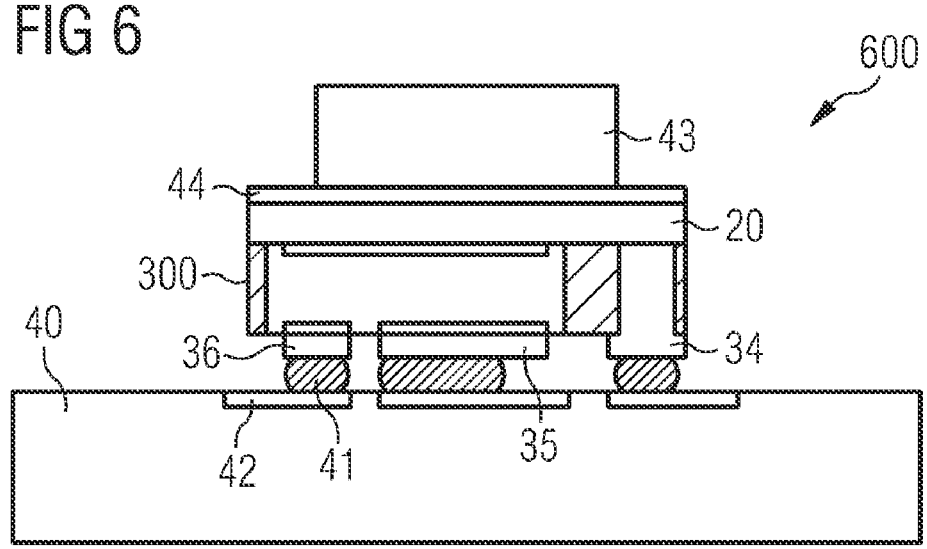
FIG. 6 schematically illustrates one embodiment of a device.

It is obvious to a person skilled in the art that the device 1000 illustrated in FIG. 10N and the manufacturing thereof as described above are only intended to be an exemplary embodiment, and many variations are possible. For example, the same or a similar variation as illustrated in FIG. 5 and the same or a similar application as illustrated in FIG. 6 are possible.

Furthermore, in the method process illustrated in FIG. 10B the semiconductor chips 10 may be mounted onto the carrier 30 with their first faces 16 facing the carrier 30. In this case, the sintered metal layer 21 may be structured at one point during the manufacturing process.

Figure 11:
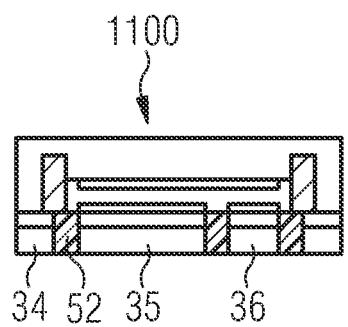
FIG. 11 schematically illustrates one embodiment of a device.

It may also be provided that after structuring the metal layers 20 and 51, the gaps between the external contact pads 34 to 36 are filled with a dielectric material 52. Such a device 1100 is schematically illustrated in FIG. 11. The dielectric material 52 may, for example, be a mold material applied by an appropriate molding process or a foil applied by lamination.

Figure 12:
FIG. 12 illustrates an image of a sintered copper surface obtained by a scanning electron microscope.

FIG. 12 illustrates an image of a surface of sintered particles, which may be used for the production of the devices described herein. The particles were made of copper, and the image was obtained by a scanning electron microscope.

Figure 13:
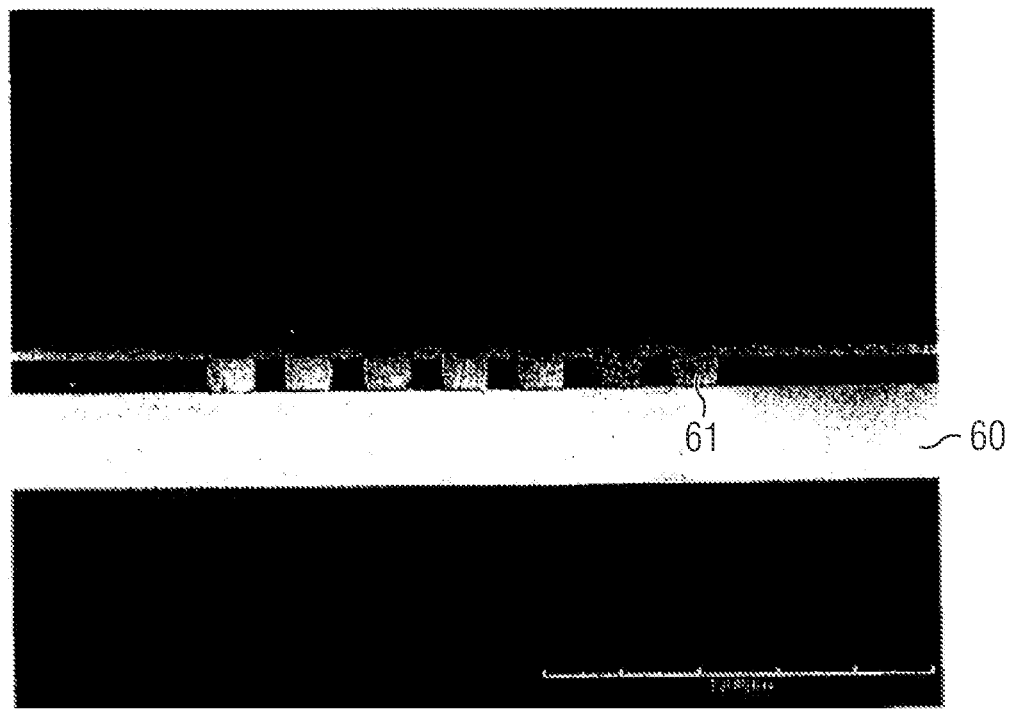
FIG. 13 illustrates an image of a cross section of a semiconductor chip obtained by a light optical microscope.
Figure 14:
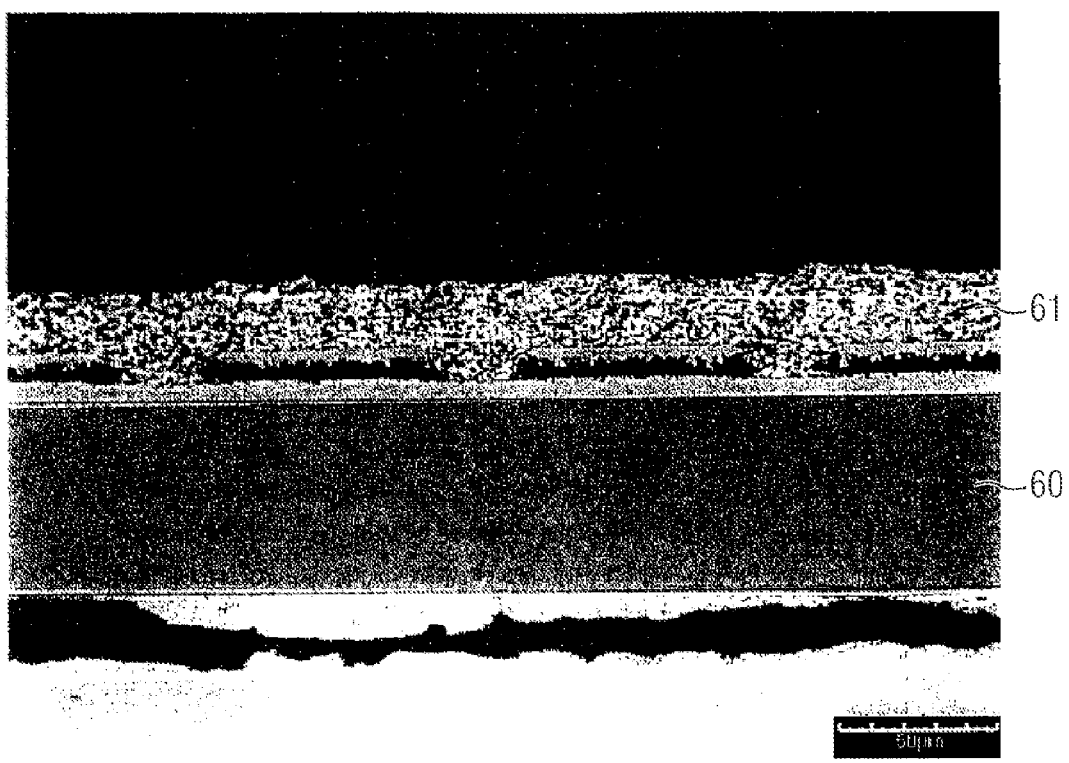
FIG. 14 illustrates an image of a cross section of a semiconductor chip obtained by a light optical microscope.

FIGS. 13 and 14 illustrate images of cross sections of semiconductor chips 60 having sintered metal particles 61 arranged on their top surfaces. The images were obtained by a light optical microscope.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   providing at least two semiconductor chips;
   applying a dielectric material to the at least two semiconductor chips to attach the at least two semiconductor chips to each other;
   selectively removing a portion of the dielectric material between the at least two semiconductor chips to form at least one recess in the dielectric material; and
   applying a metal particles comprising paste to the at least one recess in the dielectric material.

2. The method of claim 1, wherein the metal particles comprising paste is further applied to the at least two semiconductor chips and the dielectric material.

3. The method of claim 1, comprising separating the at least two semiconductor chips from each other after applying the metal particles comprising paste to the at least one recess in the dielectric material.

4. The method of claim 1, comprising attaching the at least two semiconductor chips to a first metal layer before applying the dielectric material to the at least two semiconductor chips.

5. The method of claim 4, comprising separating the at least two semiconductor chips from each other by dividing the first metal layer.

6. The method of claim 1, comprising placing the at least two semiconductor chips over a carrier before applying the dielectric material to the at least two semiconductor chips and removing the carrier after the application of the dielectric material.

7. The method of claim 6, comprising applying a second metal layer to a face of the dielectric material which is exposed by removing the carrier.

8. The method of claim 7, comprising structuring the second metal layer.

9. The method of claim 1, comprising wherein at least 50% of the metal particles have dimensions smaller than 100 nm.

10. The method of claim 1, comprising heating the metal particles after applying the metal particles comprising paste to the at least one recess in the dielectric material.

11. The method of claim 10, comprising heating the metal particles to a temperature below 300° C.

12. The method of claim 1, comprising sintering the metal particles.

13. The method of claim 12, comprising removing a portion of the metal particles after sintering the metal particles.

14. The method of claim 1, comprising selectively applying the metal particles comprising paste to contact elements of the at least two semiconductor chips.

15. The method of claim 1, wherein each of the at least two semiconductor chips has a first face comprising a first contact element and a second face opposite to the first face comprising a second contact element.

16. The method of claim 1, wherein the paste comprises a liquid, in which the metal particles are dispersed when they are applied to the at least one recess in the dielectric material.

17. The method of claim 1, comprising removing semiconductor material of the at least two semiconductor chips by etching after applying the dielectric material to the at least two semiconductor chips.

18. The method of claim 1, comprising applying the dielectric material by one of molding, dispensing and laminating.

19. A method, comprising:
   providing at least two semiconductor chips;
   applying a dielectric material to the at least two semiconductor chips to attach the at least two semiconductor chips to each other;
   selectively removing a portion of the dielectric material between the at least two semiconductor chips to form at least one recess in the dielectric material;
   applying a metal particles comprising paste to the at least one recess in the dielectric material;
   heating the metal particles; and
   separating the at least two semiconductor chips from each other.

20. The method of claim 19, comprising heating the metal particles to a temperature below 300° C.

21. The method of claim 19, comprising sintering the metal particles when heated.

* * * * *